United States Patent
Mage

(10) Patent No.: US 7,075,467 B2
(45) Date of Patent: Jul. 11, 2006

(54) ANALOG/DIGITAL CONVERTER FOR MICROWAVE FREQUENCIES

(75) Inventor: Jean-Claude Mage, Palaiseau (FR)

(73) Assignee: THALES, Neuilly sur Seine (FR)

( * ) Notice: Subject to any disclaimer, the term of this patent is extended or adjusted under 35 U.S.C. 154(b) by 0 days.

(21) Appl. No.: 10/535,854

(22) PCT Filed: Nov. 19, 2003

(86) PCT No.: PCT/EP03/50850

§ 371 (c)(1),
(2), (4) Date: May 20, 2005

(87) PCT Pub. No.: WO2004/049577

PCT Pub. Date: Jun. 10, 2004

(65) Prior Publication Data

US 2006/0012503 A1    Jan. 19, 2006

(30) Foreign Application Priority Data

Nov. 22, 2002  (FR) .................................. 02 14681

(51) Int. Cl.
H03M 1/00 (2006.01)
(52) U.S. Cl. ....................................... 341/133; 341/155
(58) Field of Classification Search ................ 341/155, 341/13, 14, 137, 133; 505/827
See application file for complete search history.

(56) References Cited

U.S. PATENT DOCUMENTS

| 4,339,543 A | 7/1982 | Mage et al. |
| 4,603,311 A | 7/1986 | Mage |
| 4,821,403 A | 4/1989 | Rolland et al. |
| 4,901,038 A | 2/1990 | Dusclaux et al. |
| 4,979,064 A | 12/1990 | Mage et al. |
| 5,307,063 A * | 4/1994 | Kratz et al. ................. 341/133 |
| 5,939,895 A * | 8/1999 | Smith ........................... 326/1 |

FOREIGN PATENT DOCUMENTS

| EP | 0 304 894 A | 3/1989 |
| JP | 01051681 | 2/1989 |

OTHER PUBLICATIONS

"Superconductive A/D Converters" Gregory S. Lee and David A. Petersen, NY Aug. 1989.

* cited by examiner

Primary Examiner—Brian Young
(74) Attorney, Agent, or Firm—Lowe Hauptman & Berner, LLP

(57) ABSTRACT

The converter of the invention essentially comprises, along the path of the microwave signal to be measured, a series of superconducting loops spaced apart by x/2 and each having a critical current junction facing which an optical waveguide is placed. Each of these loops absorbs, as the case may be, a bit of the wave to be measured, their inductances following an increasing geometric progression of common ratio 2 and their critical currents following a decreasing geometric progression of common ratio ½.

8 Claims, 1 Drawing Sheet

ANALOG/DIGITAL CONVERTER FOR MICROWAVE FREQUENCIES

CROSS REFERENCE TO RELATED APPLICATIONS

The present Application is based on International Application No. PCT/EP2003/050850, filed on Nov. 19, 2003, which in turn corresponds to FR 02/14681 filed on Nov. 22, 2002, and priority is hereby claimed under 35 USC §119 based on these applications. Each of these applications are hereby incorporated by reference in their entirety into the present application.

FIELD OF THE INVENTION

The subject of the present invention is a microwave analog/digital converter.

To produce an analog/digital converter, it is always necessary to seek a compromise between speed of acquisition and resolution. High-speed converters of the "flash" type are limited in terms of resolution by the complexity of their circuits. This is because the number of comparators that they comprise is equal to the number of measurement points, i.e. 256 comparators for an 8-bit encoder. Moreover, high-resolution encoders are limited in terms of speed owing to their operating principle (they generally comprise a 20-bit integrator operating at 50 Hz) or because of their clock frequency (14-bit $\Sigma/\Delta$-type encoders operating at 50 MHz).

In all these cases, the performance of the semiconductor circuits constituting these converters is limited by:

the stability of their frequency reference;
the precision of the reference quantity used by these encoders, this quantity being a voltage, a current or any other electromagnetic quantity;
the zero offset of the comparators;
the complexity of these circuits; and
the electrical consumption of their components.

As regards conventional $\Sigma/\Delta$ converters or flash converters (based on interferometers arranged in powers of 2) comprising superconducting circuits, these are limited in terms of speed as they must count $2^n$ points, and the number of points per second (which is equal to the product of the number of points per sample multiplied by the number of samples arriving per second) corresponds to the cut-off frequency of the superconducting material (around 600 GHz in the case of niobium and 6 THz in the case of high-$T_c$ (high-critical-temperature) superconductors. Thus, a niobium converter is in theory limited to:

300 points (i.e. about 8 bits in flash architecture) for a 2 GHz conversion frequency; and
4000 points (i.e. 12 points in $\Sigma/\Delta$ architecture) for a 200 MHz conversion frequency.

SUMMARY OF THE INVENTION

These performance characteristics are substantially the same as those of standard semiconductor converters.

A converter based on elements made of a high-$T_c$ superconductor is limited to:

300 points (i.e. 8 bits in flash architecture) for a 20 GHz conversion frequency; and
30 000 points (i.e. 15 bits in $\Sigma/\Delta$ architecture) for a 200 MHz conversion frequency.

Such performance characteristics nevertheless remain insufficient for certain applications.

The subject of the present invention is an analog/digital converter that is both high-speed and high-resolution, while being able to operate at high frequencies, for example of the order of or greater than 10 GHz.

The analog/digital converter according to the invention comprises N superconducting loops arranged along the path of the wave to be converted, these loops being regularly spaced apart by a half-wavelength, each loop having a critical current junction connected via a waveguide to an output memory cell, the product of the inductance of each loop multiplied by its critical current being equal to a constant.

Still other objects and advantages of the present invention will become readily apparent to those skilled in the art from the following detailed description, wherein the preferred embodiments of the invention are shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description thereof are to be regarded as illustrative in nature, and not as restrictive.

BRIEF DESCRIPTION OF THE DRAWINGS

The present invention will be more clearly understood on reading the detailed description of one embodiment, given by way of nonlimiting example and illustrated by the appended drawings in which:

FIG. 1 shows an "elementary comparator", which is an essential elementary component of the analog/digital converter of the invention. This elementary comparator comprises a superconducting loop 1, preferably of circular shape, in which a critical current junction 2 is made, an optical waveguide 3 and a one-bit output memory cell 4, which is sequenced at the desired acquisition rate. The junction 2 is a constriction of a few tens of nanometers, or "airgap", made in the loop 1, in which airgap a dielectric layer of a few Angstroms in thickness is formed. One of the ends of the waveguide 3 is placed almost at the contact of the junction 2, whereas its other end is connected to the memory 4. The connection between the waveguide 3 and the memory 4 is made, in a manner known per se, by a photoelectric sensor 5. The memory 4 forms part of an array of memory cells (to which array the other loops are connected, as described below with reference to FIG. 2). This array of memory cells may be an integrated memory circuit as commonly used in microcomputers.

DETAILED DESCRIPTION OF THE INVENTION

Figure 1:
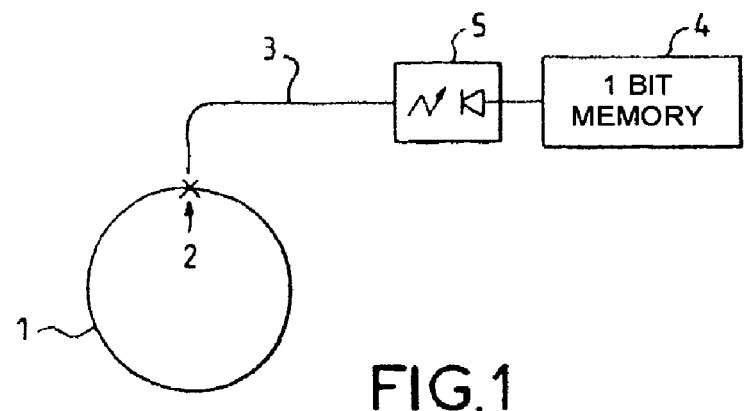
FIG. 1 is a diagram of a semiconducting loop and its output waveguide, constituting one of the elements of an analog/digital converter according to the invention.

Owing to the fact that the outputs of the converter of the invention operate at frequencies of the order of one or more terahertz ($10^{12}$ Hz), the waveguide 3 must be of a particular type in order to allow the corresponding optical mode to be established therein, and possibly to be amplified.

Advantageously, this waveguide is of the type described in the article by R. Köhler et al., published in the journal Nature, Volume 417 (6885), 156–159 on May 9, 2002.

The loop 1 is placed in the magnetic field of the signal to be measured. If this signal propagates in an electromagnetic waveguide, the loop is placed inside this waveguide. If the signal propagates in a line (for example of the stripline type), the loop is etched into this line.

The loop 1, placed in said magnetic field, can absorb a magnetic flux $\Phi_0$ such that $\Phi_0=Li_c$, L being the inductance of this loop and $i_c$ the value of the critical current that can flow in the loop 1. The loop 1 thus makes a comparison between the magnetic flux $\Phi_n$ that it receives from the signal to be measured and the reference value $\Phi_0$ that it can absorb. This $\Phi_0$ value is an absolute reference—a fundamental quantum quantity (the superconducting material of the loop is immersed in a cryogenic bath at a fixed temperature). Since the flux $\Phi_n$ created by the signal to be measured depends on the current of this analog signal, an array of comparators having the specified characteristics described below makes it possible, after calibration, to produce a digital signal representing the amplitude of this analog signal, each of the comparators producing one of the bits of this digital signal.

If $\Phi_n<\Phi_0$, the superconducting loop of rank n does not absorb any flux, and an absence of a bit, equivalent to a bit $_n$ of value "0", is temporarily stored in the loop.

If $\Phi_n\geq\Phi_0$, the superconducting loop of rank n absorbs flux, and the loop temporarily stores a bit $_n$ of value "1".

The storage in memory of a "1" bit in the loop 1 causes the transmission of a voltage pulse, of duration of the order of one or more picoseconds, through the junction 2. This pulse is picked up by the waveguide 3 and transmitted in optical form, before being converted into a voltage by the device 5 and stored by the memory 4.

If a bit$_n$="0", no voltage pulse is transmitted through the junction 2, and the memory 4 does not receive a pulse. It remains at zero (if it was zero previously). Resetting to zero takes place automatically when the signal passes through zero.

After this storage step, the flux $\delta\phi_n$ output by the comparator and transmitted to the next comparator is: $\delta\Phi_n=\Phi_n-$(bit$_n\cdot\Phi_0$).

This subtraction is performed by the expulsion of the residual field by the superconducting loop. It should be noted that $\delta\Phi_n<\Phi_0$, because, as will be described below, the comparators are arranged, in the direction of propagation of the signal to be measured, in the decreasing order of their binary weight $2^n$.

Thus, the comparator of FIG. 1 is used to carry out the 1-bit analog/digital converter function. The signal to be measured may result either from the sampling of an incident signal by a sample-and-hold device, driven by a reference clock, or from the conversion of this incident signal by frequency mixing using a stable local oscillator that oscillates at a frequency F of greater than twice the maximum frequency of the incident signal. The latter approach is preferred when the incident signal is a microwave signal with a frequency of around 1 GHz to 100 GHz.

To produce an N-bit converter, N comparators are placed along the path of the signal to be measured, but this can be done only if, when considering a comparator of rank m:
  either the output signal from the comparator of rank m−1 is multiplied by 2, so as to obtain, for the input of the comparator of rank m, $\Phi_{m-1}=2\delta\Phi_n$, thereby making it possible to use comparators that are all identical to one another,
  or the current reference of the comparator of rank m+1 is divided by 2, by varying both its inductance L and its critical current $i_c$.

It should be noted that in an N-bit converter the number of significant bits is fixed by the precision of the technology of the loop (the precision of the value of its inductance and its critical current) and of the reference clock or the reference oscillator (in particular its spectral purity), depending on whether the processing of the incident signal is carried out by sampling or by frequency conversion.

The number of comparators that an N-bit converter comprises may be greater than N. This makes it possible to preserve, after the conversion, only the bits of most significant weight. It is thus possible to make an automatic range change of the converter according to the dynamics of the incident signal. Advantageously, the converter may be preceded by a low-noise amplifier so as to adjust its dynamic range to that of the incident signal.

The clock (or the reference oscillator) may advantageously be produced in superconducting technology so as to reduce its jitter (or its phase noise).

The signal processing chain (not shown) connected up downstream of the converter may comprise error correction circuits (or may employ error correction codes). Thus, it is possible to tolerate lower precision in the parameters L and $i_c$ that determine the flux $\Phi_0=Li_c$.

The digital memories of a converter are typically read at the frequency F of the aforementioned local oscillator. In the case of the architecture shown in FIG. 2 (called a "pipeline" architecture), the bits read in the successive digital memories (in the order of propagation of the signal to be measured) must each time be offset from a sample in order to take into account the propagation time of the signal to be measured from one loop 1 to the next. Of course, the digital processing carried out on the bits read in the memories 4 must take into account this offset. Alternatively, the reading of these memories 4 may be accompanied by phase resetting of all the bits of each sample of the signal to be measured. This phase resetting may be carried out inside the converter by varying the lengths of the connecting lines to the memories 4, so as to deliver all the bits of one sample at the same instant.

The conversion of the input signal by mixing at the frequency F effects an automatic zero-resetting of the comparators and of each digital output memory 4 at each half-period of the signal from the oscillator.

Figure 2:
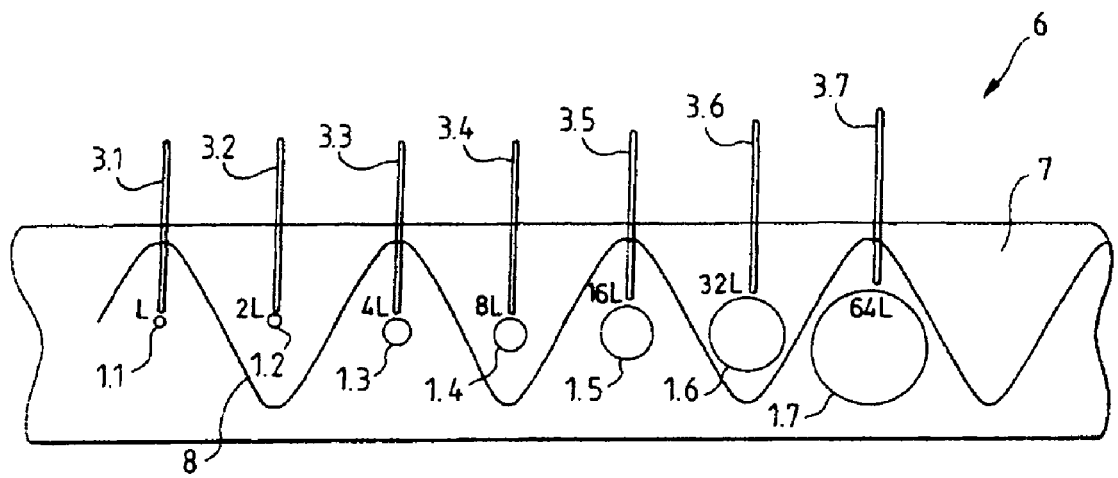
FIG. 2 is the simplified partial diagram of an analog/digital converter according to the invention.

FIG. 2 shows, in a simplified manner, the pipeline architecture 6, which in fact comprises a large number N (N may be greater than 100) of comparators based on superconducting loops placed along a microstrip line 7. Only seven of these loops, referenced 1.1 to 1.7, with their respective optical waveguides 3.1 to 3.7 have been shown. The direction of propagation of the signal to be measured goes from the left to the right in the diagram, as shown in FIG. 2. The oscillation of the signal to be measured has been shown symbolically by a sinusoid 8. The superconducting loops are regularly spaced apart, their spacing pitch being equal to a half-wavelength of the signal to be measured. In the case of the embodiment shown, the inductance of the successive superconducting loops follows an increasing geometric progression of common ratio 2: their inductances are, for the loops 1.1 to 1.7, equal to L 2L, 4L, 8L, 16L, 32L and 64L respectively, whereas their critical current follows a decreasing geometric progression of common ratio ½ namely $i_c$, $i_c/2$, $i_c/4$, ... $i_c/64$.

The converter 6 operates as follows.

The current i of the signal to be measured has, in a loop of rank n forming part of the N superconducting loops 1.1 to 1.N (in which N may take one of the values 1 to N), the instantaneous value $i_n$. This current in induces a flux $\Phi_n = L_n i_n$ in the loop 1.n ($L_n$ being the value of the inductance of the loop 1.n).

Since $\Phi_{0n}$ is the threshold value of the flux that the loop 1.n can absorb, which corresponds to the critical current $ic_n$ of this loop, the loop "compares" $\Phi_{0n}$ with $\Phi_n$:

if $\Phi_n < \Phi_{0n}$, the current $i_n$ continues to propagate undisturbed beyond the loop 1.n;

if $\Phi_n \geq \Phi_{0n}$, a flux quantum $\Phi_{0n}$ is absorbed by the loop 1.n and the current $i_n$ is decreased by $\Phi_{0n}/L_n$. It follows that the outgoing current (downstream of the loop 1.n) has the value $i_n - \Phi_{0n}/L_n$ and the next loop 1.(n+1) therefore receives the current $i_{(n+1)} = i_n - \Phi_{0n}/L_n$. This induced current in the loop 1.(n+1) has the value $L_{(n+1)} = 2L_n$ and its critical current is equal to $i_{c(n+1)} = i_{cn}/2$. Thus: $\Phi_{(n+1)} = L_{(n+1)} i_{(n+1)} = 2 L_n i_{(n+1)}$. The loop 1.(n+1) then "compares" $\Phi_{0(n+1)}$ with $\Phi_{(n+1)}$:

if $\Phi_{(n+1)} < \Phi_{0(n+1)}$, the current continues to propagate undisturbed toward the next loops;

if $\Phi_{(n+1)} \geq \Phi_{0(n+1)}$, a flux quantum $\Phi_{0(n+1)}$ is absorbed by the loop 1.(n+1) and the current of the signal to be measured is reduced by $\Phi_{0(n+1)}/L_{(n+1)} = \Phi_{0(n+1)}/2L_n$. It follows that the outgoing current, just downstream of the loop 1.(n+1) is equal to $i_{(n+1)} - \Phi_{0(n+1)}/L_{(n+1)}$, and so on as far as the last loop 1.N.

The structure 6 is quite simple to produce, but the loops 1.1 to 1.N and their critical junctions must be fabricated very meticulously. In an alternative embodiment (not shown), all the comparators are identical to one another, and an amplifier with a gain of 2 is inserted at the output of each comparator (except for the last one). The main advantage of such a structure is that a current of the same order of magnitude is maintained right along the line (in its part along which the N comparators are placed). However, the amplifiers with a gain of 2 are tricky to produce, as it is necessary for this gain to be very precise and for their operating speed to be high.

According to another alternative embodiment of the converter of the invention, this is combined with a microwave waveguide. The superconducting loops are then placed inside the waveguide, perpendicular to the axis of the waveguide (i.e. the direction of propagation of the signal to be measured). In this case too, the comparators may either comprise superconducting loops having inductances that increase in a geometric progression, as in the case of FIG. 2, or comprise loops that are all identical but each associated with an amplifier with a gain of 2.

In all the embodiments, the first comparator met by the signal to be measured (1.1) delivers the bit of highest weight of the digital signal, the following comparators delivering the following bits in decreasing order.

Of course, means known per se are used to calibrate the converter and adapt its measurement range to the dynamic range and to the absolute value of the signal to be measured.

Thus, by employing flux quantization in a superconducting circuit, it is possible to achieve better performance than that of the known semiconductor converters mentioned in the preamble as regards the following points:

stability of the frequency reference: the oscillator comprises a cooled resonator possessing a very high quality factor;

precision of the reference: it is tied to the absolute reference of the flux quantum $\Phi_{0n}$;

offset: absence of offset or of associated offset drift thanks to the temperature stabilization of the superconducting circuits;

circuit architecture: this is very simple (loops, optical fibers and memories);

electrical consumption: very low (only storage circuits).

Furthermore, the superconducting circuits permit high resolution, of much better than 8 bits, thanks to the large number of loops that can be used. The conversion frequency may be higher than 10 GHz. The sensitivity of this converter is high, thanks to the intrinsic properties of the superconducting junctions.

It will be readily seen by one of ordinary skill in the art that the present invention fulfills all of the objects set forth above. After reading the foregoing specification, one of ordinary skill will be able to affect various changes, substitutions of equivalents and various other aspects of the invention as broadly disclosed herein. It is therefore intended that the protection granted hereon be limited only by the definition contained in the appended claims and equivalents thereof.

The invention claimed is:

1. A microwave analog/digital converter, comprising N comparators consisting of superconducting loops placed along the path of the wave to be converted, these loops being regularly spaced apart by a half-wavelength, each loop having a critical current junction connected via an optical waveguide to an output memory cell, the product of the inductance of each loop multiplied by its critical current ($Li_c$) being equal to a constant.

2. The converter as claimed in claim 1, wherein, in a direction of propagation of the wave to be measured, the value of the inductance of the respective loops follows an increasing geometric progression of common ratio 2, whereas the value of their critical current follows a decreasing geometric progression of common ratio ½.

3. The converter as claimed in claim 1, wherein all the loops are identical to each other, the output of each loop being connected to a times-2 multiplier.

4. The converter as claimed in claim 1, wherein the number of comparators is greater than the number of significant bits of the converter.

5. The converter as claimed in claim 1, wherein, for phase-resetting the bits of each sample of the signal to be measured, it includes lines of variable length in order to deliver all the bits of the same sample at the same instant.

6. The converter as claimed in claim 2, wherein, for phase-resetting the bits of each sample of the signal to be measured, it includes lines of variable length in order to deliver all the bits of the same sample at the same instant.

7. The converter as claimed in claim 3, wherein, for phase-resetting the bits of each sample of the signal to be measured, it includes lines of variable length in order to deliver all the bits of the same sample at the same instant.

8. The converter as claimed in claim 4, wherein, for phase-resetting the bits of each sample of the signal to be measured, it includes lines of variable length in order to deliver all the bits of the same sample at the same instant.

* * * * *